United States Patent [19]
Ishii et al.

[11] Patent Number: 5,755,989
[45] Date of Patent: May 26, 1998

[54] WET ETCHING COMPOSITION HAVING EXCELLENT WETTING PROPERTY FOR SEMICONDUCTORS

[75] Inventors: Masao Ishii; Tomohiro Hosomi; Shigeru Maruyama; Mitsushi Itano, all of Settsu, Japan

[73] Assignee: Daikin Industries, Ltd., Osaka, Japan

[21] Appl. No.: 495,598

[22] PCT Filed: Feb. 2, 1994

[86] PCT No.: PCT/JP94/00147

§ 371 Date: Aug. 2, 1995

§ 102(e) Date: Aug. 2, 1995

[87] PCT Pub. No.: WO94/18696

PCT Pub. Date: Aug. 18, 1994

[30] Foreign Application Priority Data

Feb. 4, 1993 [JP] Japan ......................... 5-41999

[51] Int. Cl.$^6$ ..................... H01L 21/306; H01L 21/308
[52] U.S. Cl. ........................... 252/79.4; 252/79.3
[58] Field of Search ............................ 252/79.1, 79.2, 252/79.3, 79.4; 216/101, 103, 104

[56] References Cited

U.S. PATENT DOCUMENTS

| | | | |
|---|---|---|---|
| 4,517,106 | 5/1985 | Hopkins et al. | 252/79.4 |
| 4,582,624 | 4/1986 | Enjo et al. | 252/79.4 |
| 4,620,934 | 11/1986 | Hopkins et al. | 252/79.4 |
| 4,795,582 | 1/1989 | Ohmi et al. | 252/79.4 |

FOREIGN PATENT DOCUMENTS

| | | |
|---|---|---|
| 03053083 | 3/1991 | Japan . |
| 3-53083 A | 3/1991 | Japan . |

*Primary Examiner*—R. Bruce Breneman
*Assistant Examiner*—George Goudreau
*Attorney, Agent, or Firm*—Kubovcik & Kubovcik

[57] ABSTRACT

The present invention provides a wet etching composition for semiconductors which is characterized in that a surfactant comprising the two components of an alkylsulfonic acid and an ω-hydrofluoro-alkylcarboxylic acid is added to a buffered hydrofluoric acid composed of hydrogen fluoride, ammonium fluoride and water.

9 Claims, No Drawings

WET ETCHING COMPOSITION HAVING EXCELLENT WETTING PROPERTY FOR SEMICONDUCTORS

TECHNICAL FIELD

The present invention relates to wet etchants which are suitable for use in the wet etching process for semiconductor devices having high integration densities and which are improved especially in wetting property for use in fine working.

BACKGROUND ART

Many wet etching compositions (wet etchants) are already known which have a surfactant incorporated therein. For example, JP-B-19509/1987 discloses such a composition. With an increase in the integration density of semiconductor devices, however, the conventional surfactant-containing buffered hydrofluoric acid has become no longer satisfactory in wetting property. A mere increase in the amount of surfactant to be used fails to solve the problems associated with the solubility and cleaning property of the surfactant itself and further needs consideration to the resulting demerit with respect to cost. Accordingly, there arises a need to investigate new surfactants, whereas extreme difficulties are encountered in exploring surfactants which can be given an enhanced wetting property without sacrificing the conventional features of surfactants such as solubility, stability, usefulness in a small amount, low foaming property and property to ensure ease of cleaning.

We have conducted intensive research in order to overcome these problems and consequently found that some kinds of surfactants exhibit an outstanding wetting property with the usual features thereof unimpaired when used in combination although failing to produce a noticeable effect if used singly.

An object of the present invention is to provide a wet etching composition having all the features conventionally possessed by surfactants and yet exhibiting an excellent wetting property.

DISCLOSURE OF THE INVENTION

The present invention provides a wet etching composition for semiconductors which is characterized in that a surfactant comprising the two components of an alkylsulfonic acid and an ω-hydrofluoroalkylcarboxylic acid is added to a buffered hydrofluoric acid composed of hydrogen fluoride, ammonium fluoride and water.

According to the invention, an alkylsulfonic acid and an ω-hydrofluoroalkylcarboxylic acid are added to buffered hydrofluoric acid in proportions in accordance with the composition of the acid. The resulting composition then exhibits such a wetting property that is not available when these components are added singly. Combinations of other surfactants failed to produce an expected effect since the compatibility involved a problem, or the wetting property remained unaltered or the combination led to a less satisfactory result than is the case with single use.

Examples of preferred alkylsulfonic acids for use in the present invention are compounds represented by $C_nH_{2n+1}SO_3H$ wherein n is an integer of 5 to 10, more preferably an integer of 6 to 9. More specific examples are $C_6H_{13}SO_3H$, $C_7H_{15}SO_3H$, $C_8H_{17}SO_3H$, $C_9H_{19}SO_3H$, etc. $C_7H_{15}SO_3H$ and $C_8H_{17}SO_3H$ are especially preferable.

Examples of preferred ω-hydrofluoroalkylcarboxylic acids are compounds represented by $H(CF_2)mCOOH$ wherein m is an integer of 1 to 10, more preferably an integer of 4 to 8. More specific examples are $H(CF_2)_4COOH$, $H(CF_2)_6COOH$, $H(CF_2)_8COOH$, etc. $H(CF_2)_6COOH$ is especially preferable.

The surfactants to be used in the present invention contain none of potassium, sodium, calcium and like metals in the molecule and are therefore unlikely to produce any electrically adverse influence on semiconductor materials.

The etching composition of the invention can be prepared by mixing the components together. The order in which they are added is not limited. The composition can be prepared, for example, by dissolving a required amount of the surfactant in one of hydrogen fluoride or an aqueous solution of ammonium fluoride and thereafter mixing the other with the resulting solution, or by mixing together hydrogen fluoride and the aqueous solution of ammonium fluoride first and adding the required amount of the surfactant to the mixture to obtain a solution. Also usable is a method comprising dissolving the alkylsulfonic acid in one of hydrogen fluoride and ammonium fluoride, dissolving the ω-hydrofluoroalkylcarboxylic acid in the other and thereafter mixing together the two solutions. The surfactant to be added need not be a single one, but a plurality of surfactants may be used conjointly.

According to the present invention, the amount of surfactant to be added is usually 1 to 10,000 ppm (weight), preferably 5 to 1,500 ppm, more preferably 10 to 1,000 ppm, based on the whole composition. If the amount of surfactant is smaller than the above lower limit, the presence of surfactant produces little or no effect, whereas use of more than 10,000 ppm fails to achieve a corresponding effect and is disadvantageous.

The preferred embodiments of etching composition of the invention are as follows.

(1) An etching composition comprising a buffered hydrofluoric acid composed of hydrogen fluoride, ammonium fluoride and water, an alkylsulfonic acid represented by the formula $C_nH_{2n+1}SO_3H$ (wherein n is an integer of 5 to 10) and added to the hydrofluoric acid in an amount of 10 to 1,000 ppm (weight) based on the whole composition, and an ω-hydrofluoroalkylcarboxylic acid represented by the formula $H(CF_2)mCOOH$ (wherein m is an integer of 1 to 10) and added to the hydrofluoric acid in an amount of 100 to 1,000 ppm (weight) based on the whole composition.

(2) An etching composition as set forth in paragraph (1) wherein the alkylsulfonic acid is $C_7H_{15}SO_3H$ and added in an amount of 10 to 1,000 ppm (weight) based on the whole composition, and the ω-hydrofluoroalkylcarboxylic acid is $H(CF_2)_6COOH$ and added in an amount of 100 to 1,000 ppm (weight) based on the whole composition.

(3) An etching composition as set forth in paragraph (1) wherein the alkylsulfonic acid is $C_8H_{17}SO_3H$ and added in an amount of 10 to 1,000 ppm (weight) based on the whole composition, and the ω-hydrofluoroalkylcarboxylic acid is $H(CF_2)_6COOH$ and added in an amount of 300 to 1,000 ppm (weight) based on the whole composition. When the amount of ω-hydrofluoroalkylcarboxylic acid, $H(CF_2)_6COOH$, is less than 300 ppm (weight) based on the whole composition, the defoaming effect available is not so satisfactory as is produced when $C_7H_{15}SO_3H$ is used as the alkylsulfonic acid.

The present invention has further revealed that the optimum kind of surfactant to be added and the optimum amount thereof based on the whole composition are dependent on the concentrations of ammonium fluoride and hydrogen fluoride in the etching composition, hence the following compositions.

(4) When the concentration of ammonium fluoride in the etching composition is 25 wt. %≦amonium fluoride≦41 wt. %, and when the concentration of hydrogen fluoride therein is (a) 5 wt. %<hydrogen fluoride≦10 wt. %, an etching composition comprising 50 to 80 ppm (weight) of $C_8H_{17}SO_3H$ based on the whole composition, and 400 to 1,000 ppm (weight) of $H(CF_2)_6COOH$ based on the whole composition, (b) 1 wt. %<hydrogen fluoride≦5 wt. %, an etching composition comprising 10 to 50 ppm (weight) of $C_8H_{17}SO_3H$ based on the whole composition, and 300 to 500 ppm (weight) of $H(CF_2)_6COOH$ based on the whole composition, (c) 0.1 wt. %<hydrogen fluoride≦1 wt. %, an etching composition comprising 80 to 100 ppm (weight) of $C_7H_{15}SO_3H$ based on the whole composition, and 100 to 300 ppm (weight) of $H(CF_2)_6COOH$ based on the whole composition. The desired effect of the invention is greater in this case than when $C_8H_{17}SO_3H$ is used as the alkylsulfonic acid.

(5) When the concentration of ammonium fluoride in the etching composition is 15 wt. %<ammonium fluoride≦25 wt. %, an etching composition comprising 50 to 1,000 ppm (weight) of $C_8H_{17}SO_3H$ based on the whole composition, and 400 to 1,000 ppm (weight) of $H(CF_2)_6COOH$ based on the whole composition, regardless of the concentration of hydrogen fluoride. Although $C_7H_{15}SO_3H$ is also usable as the alkylsulfonic acid in this case, $C_8H_{17}SO_3H$, when used, can be smaller in amount and is therefore desirable.

The concentration of ammonium fluoride in the etching compositions (4) and (5) is up to 41 wt. % because of the limit of solubility of ammonium fluoride in water. Further concentrations not greater than 15 wt. % are undesirable since etching faults will then occur.

If the concentration of hydrogen fluoride in the etching composition is not higher than 0.1 wt. %, the etch rate is very low, rendering the composition practically unusable. Conversely, concentrations over 10 wt. % lead to an excessively high etch rate, presenting difficulty in controlling the etching time, hence an undesirable composition.

The ratio of ammonium fluoride to hydrogen fluoride is the same as in the prior art. To be suitable, the ratio is, for example, at least 5 parts by weight of ammonium fluoride per part by weight of 50 % hydrogen fluoride.

The above-specified two kinds of surfactants incorporated in an etching solution comprising hydrogen fluoride and ammonium fluoride enable the etching composition of the invention to exhibit a favorably improved wetting property on various surface of semiconductor substrates without impairing the advantage of the etching solution in any way even when the composition is allowed to stand for a long period of time after preparation, thereby permitting the composition to readily penetrate into fine clearances in resist films. Accordingly, the composition has the noteworthy advantage that fine patterns can be etched without irregularities, and that even materials having narrow clearances and wide clearances in a resist film can be etched at the same rate. The composition of the present invention further has the advantages of being free of foaming that is detrimental to the etching operation, not collecting dust on the surface of the film to be etched and being capable of etching silicon oxide films without variations in etch rate despite the presence of the surfactants.

The etching composition of the present invention also has the advantage of being usable for uniformly etching the entire surface of wafers to a mirror finish.

BEST MODE OF CARRYING OUT THE INVENTION

The present invention will be described in detail with reference to the following examples and comparative examples, in which percentages are by weight.

EXAMPLES 1 TO 5 AND COMPARATIVE EXAMPLES 1 TO 18

Surface Tension Test and Appearance Test

Etching compositions were prepared by adding various surfactants listed in Table 1 to solutions obtained by mixing together 50% hydrogen fluoride and 40 wt. % aqueous solution of ammonium fluoride, along with ultrapure water as required, in varying ratios. The compositions were allowed to stand at room temperature and sampled.

For sampling, the composition was placed into a 50-ml polytetrafluoroethylene container having a flat bottom using a device comprising a 20-ml pipet made of plastics and having a plastics pipeter attached thereto. The surface tension of the sample was measured by a Du Noüy tensiometer at 25° C.

Samples were also tested for solubility, contact angle on a resist, defoaming time and number of particles. Tables 1 and 2 show the results.

To determine the defoaming time, 100 ml of sample was placed into a 250-ml container, vertically shaken (shaking stroke length 20 cm) 300 times/min for 5 minutes and thereafter allowed to stand. The time taken for the resulting foam to disappear from the liquid surface was measured.

The solubility was determined using a platinum ring having a diameter of about 15 mm and prepared by thoroughly washing with ultrapure water and thereafter removing the water with a flame of alcohol lamp. A film of sample was formed on the ring and visually checked for the presence of crystals or the like at room temperature.

To determine the contact angle, the resist to be used for measurement was applied to a silicon wafer, which was then cut into a piece approximately measuring 15 mm×15 mm. A drop of sample was applied to the resist coating, whereupon the degree of spreading of the drop was measured using a contact angle meter (Model CA-D, product of Kyowa Kaimenkagaku Co., Ltd.). The measurement was made at room temperature.

The number of particles was measured using 11 high-density polyethylene containers which were prepared by thoroughly washing with ultrapure water and thereafter ensuring that each container itself was free from particles. The sample solution was filtered with 0.1-µm filter, about 800 ml of the filtrate solution was placed into each container, and the number of fine particles in the solution was measured by a fine particle measuring device of the light scattering type (RION KL-22). The measurement was done at room temperature.

TABLE 1

| | HF concn (wt. %) | NH₄F concn (wt. %) | Surfactant Kind | concn | Solubility |
|---|---|---|---|---|---|
| Ex.1 | 6.0 | 30.0 | $C_8H_{17}SO_3H$ | 70 | o |
| | | | $H(CF_2)_6COOH$ | 800 | |
| Ex.2 | 6.0 | 30.0 | $C_7H_{15}SO_3H$ | 300 | o |
| | | | $H(CF_2)_6COOH$ | 800 | |
| Ex.3 | 3.2 | 36.9 | $C_8H_{17}SO_3H$ | 15 | o |
| | | | $H(CF_2)_6COOH$ | 400 | |
| Ex.4 | 0.5 | 39.5 | $C_7H_{15}SO_3H$ | 100 | o |
| | | | $H(CF_2)_6COOH$ | 100 | |
| Ex.5 | 6.5 | 17.4 | $C_8H_{17}SO_3H$ | 800 | o |
| | | | $H(CF_2)_6COOH$ | 400 | |
| Com.Ex.1 | 6.0 | 30.0 | $C_8H_{17}SO_3H$ | 70 | o |
| Com.Ex.2 | 6.0 | 30.0 | $C_8H_{17}SO_3H$ | 200 | o |
| Com.Ex.3 | 6.0 | 30.0 | $H(CF_2)_6COOH$ | 800 | o |
| Com.Ex.4 | 6.0 | 30.0 | $C_8H_{17}OSO_3H$ | 50 | x |
| Com.Ex.5 | 6.0 | 30.0 | $C_8H_{17}COOH$ | 50 | x |
| Com.Ex.6 | 6.0 | 30.0 | $C_6F_{13}COOH$ | 50 | o |

TABLE 1-continued

|  | HF concn (wt. %) | NH₄F concn (wt. %) | Surfactant Kind | concn | Solubility |
|---|---|---|---|---|---|
| Com.Ex.7 | 6.0 | 30.0 | C₈H₁₇SO₃H<br>C₆F₁₃COOH | 70<br>50 | ○ |
| Com.Ex.8 | 6.0 | 30.0 | H(CF₂)₆COOH<br>C₆F₁₃COOH | 800<br>50 | ○ |
| Com.Ex.9 | 3.2 | 36.9 | C₈H₁₇SO₃H | 15 | ○ |
| Com.Ex.10 | 3.2 | 36.9 | C₈H₁₇SO₃H | 100 | ○ |
| Com.Ex.11 | 3.2 | 36.9 | H(CF₂)₆COOH | 400 | ○ |
| Com.Ex.12 | 0.5 | 39.5 | C₈H₁₇SO₃H | 10 | ○ |
| Com.Ex.13 | 0.5 | 39.5 | C₇H₁₅SO₃H | 100 | ○ |
| Com.Ex.14 | 0.5 | 39.5 | H(CF₂)₆COOH | 100 | ○ |
| Com.Ex.15 | 6.5 | 17.4 | C₈H₁₇SO₃H | 800 | ○ |
| Com.Ex.16 | 6.5 | 17.4 | C₈H₁₇SO₃H | 1000 | ○ |
| Com.Ex.17 | 6.5 | 17.4 | H(CF₂)₆COOH | 400 | ○ |
| Com.Ex.18 | 6.5 | 17.4 | H(CF₂)₆COOH | 800 | ○ |

TABLE 2

|  | A | B | | C | D | Note |
|---|---|---|---|---|---|---|
|  |  | g line | i line |  |  |  |
| Ex.1 | 27 | 25 | 31 | 2.5 | 30 |  |
| Ex.2 | 30 | 24 | 26 | 1 | 45 |  |
| Ex.3 | 28 | 28 | 34 | 2 | 35 |  |
| Ex.4 | 27 | 15 | 18 | 5 | 30 |  |
| Ex.5 | 36 | 26 | 30 | <1 | 40 |  |
| Com.Ex.1 | 45 | 42 | 45 | 6 | 60 |  |
| Com.Ex.2 | 33 | 18 | 20 | 60< | — | No defoam |
| Com.Ex.3 | 37 | 45 | 50 | <1 | 30 |  |
| Com.Ex.4 | — | — | — | — | — | Insoluble, separated |
| Com.Ex.5 | — | — | — | — | — | Insoluble, separated |
| Com.Ex.6 | 23 | 55 | 59 | 5 | — | solubility upper limit |
| Com.Ex.7 | 22 | 27 | 31 | 60< | — | No defoam |
| Com.Ex.8 | 24 | 20 | 23 | 15 | — | difficult to defoam |
| Com.Ex.9 | 48 | 73 | 82 | 15 | — | difficult to de foam |
| Com.Ex.10 | 27 | 15 | 17 | 60< | — | No defoam |
| Com.Ex.11 | 33 | 40 | 45 | <1 | 30 |  |
| Com.Ex.12 | 39 | 79 | 88 | 30< | — | difficult to de foam |
| Com.Ex.13 | 42 | 56 | 63 | 2 | — |  |
| Com.Ex.14 | 36 | 56 | 63 | <1 | — |  |
| Com.Ex.15 | 40 | 32 | 36 | 1 | — |  |
| Com.Ex.16 | 36 | 19 | 21 | 8 | — | difficult to defoam |
| Com.Ex.17 | 56 | 65 | 73 | <1 | 30 |  |
| Com.Ex.18 | 49 | 59 | 66 | <1 | — |  |

A: Surface tension (dynes/cm)
B: Contact angle on positive resist
C: Defoaming time (min)
D: Number of particles in solution [per c.c. (0.2 μm ≦)]

Industrial Applicability

Use of the wet etchant of the invention enables the wet process for semiconductor devices of high integration density to achieve an improved yield. The improved wetting property permits finer working than is conventionally possible, so that the existing wet process equipment is usable as it is. This reduces a huge investment in equipment due to the contemplated change-over to the dry process.

We claim:

1. A wet etching composition for semiconductors comprising:
   a surfactant comprised of an alkylsulfonic acid and an ω-hydrofluoroalkylcarboxylic acid; and
   a buffered hydrofluoric acid comprised of hydrogen fluoride, ammonium fluoride and water.

2. A wet etching composition as defined in claim 1 wherein the alkylsulfonic acid is represented by $C_nH_{2n+1}SO_3H$ (n is an integer of 5 to 10) and the ω-hydrofluoroalkylcarboxylic acid is represented by $H(CF_2)mCOOH$ (m is an integer of 1 to 10).

3. A wet etching composition as defined in claim 1 wherein the alkylsulfonic acid is added in an amount of 10 to 1,000 ppm (weight) based on the whole composition, and the ω-hydrofluoroalkylcarboxylic acid is added in an amount of 100 to 1,000 ppm (weight) based on the whole composition.

4. A wet etching composition as defined in claim 2 wherein the alkylsulfonic acid is $C_7H_{15}SO_3H$ and the ω-hydrofluoroalkylcarboxylic acid is $H(CF_2)_6COOH$.

5. A wet etching composition as defined in claim 2 wherein the alkylsulfonic acid is $C_8H_{17}SO_3H$, the ω-hydrofluoroalkylcarboxylic acid is $H(CF_2)_6COOH$, and the ω-hydrofluoroalkylcarboxylic acid is added in an amount of 300 to 1,000 ppm (weight) based on the whole composition.

6. A wet etching composition as defined in claim 4 wherein said composition contains 25–41 wt % of ammonium fluoride, >0.1 wt % of hydrogen fluoride, 80 to 100 ppm (weight) of $C_7H_{15}SO_3H$ based on the whole composition, and 100 to 300 ppm (weight) of $H(CF_2)_6COOH$ based on the whole composition.

7. A wet etching composition as defined in claim 5 wherein said composition contains 25–41 wt % of ammonium fluoride, >1 to 5 wt % of hydrogen fluoride, 10 to 50 ppm (weight) of $C_8H_{17}SO_3H$ based on the whole composition, and 300 to 500 ppm (weight) of $H(CF_2)_6COOH$ based on the whole composition.

8. A wet etching composition as defined in claim 5 wherein said composition contains 25–41 wt % of ammonium fluoride, >5 to 10 wt % of hydrogen fluoride, 50 to 80 ppm (weight) of $C_8H_{17}SO_3H$ based on the whole composition, and 400 to 1,000 ppm (weight) of $H(CF_2)_6COOH$ based on the whole composition.

9. A wet etching composition as defined in claim 5 wherein said composition contains 15–25 wt % of ammonium fluoride, 50 to 1,000 ppm (weight) of $C_8H_{17}SO_3H$ based on the whole composition, and 400 to 1,000 ppm (weight) of $H(CF_2)_6COOH$ based on the whole composition.

* * * * *